United States Patent [19]
Wheat et al.

[11] Patent Number: 5,958,566
[45] Date of Patent: Sep. 28, 1999

[54] METAL BOND STRENGTH IN POLYOLEFIN FILMS

[75] Inventors: William R. Wheat; Aiko Hanyu, both of Houston, Tex.

[73] Assignee: Fina Technology, Inc., Dallas, Tex.

[21] Appl. No.: 08/954,325

[22] Filed: Oct. 17, 1997

[51] Int. Cl.$^6$ .................................................. B32B 7/02
[52] U.S. Cl. ................... 428/215; 428/323; 428/461; 428/35.7; 428/457
[58] Field of Search .................... 428/347, 215, 428/349, 463, 323, 515, 461, 213, 35.7, 333, 457, 500; 525/285, 186; 264/173.15, 210.6

[56] References Cited

U.S. PATENT DOCUMENTS

| | | | |
|---|---|---|---|
| 3,900,625 | 8/1975 | Chen | 428/110 |
| 3,970,722 | 7/1976 | Ogihara et al. | 260/878 |
| 4,298,718 | 11/1981 | Mayr et al. | 526/125 |
| 4,544,717 | 10/1985 | Mayr et al. | 526/125 |
| 4,692,380 | 9/1987 | Reid | 428/349 |
| 4,794,096 | 12/1988 | Ewen | 502/117 |
| 4,975,403 | 12/1990 | Ewen | 502/113 |
| 5,425,996 | 6/1995 | Wilkie et al. | 428/461 |
| 5,489,473 | 2/1996 | Wilkie | 428/323 |
| 5,573,723 | 11/1996 | Peiffer et al. | 264/448 |
| 5,731,093 | 3/1998 | Chang et al. | 428/463 |
| 5,766,532 | 6/1998 | Peiffer et al. | 264/210.6 |
| 5,773,142 | 6/1998 | Murschall et al. | 428/349 |

FOREIGN PATENT DOCUMENTS

| | | | |
|---|---|---|---|
| 2178104 | 6/1996 | Canada | B29C 55/12 |
| 0115940 | 12/1986 | European Pat. Off. | |

*Primary Examiner*—William Krynski
*Assistant Examiner*—B. Shewareged
*Attorney, Agent, or Firm*—Jimmy D. Wheelington; William D. Jackson; M. Norwood Cheairs

[57] ABSTRACT

The present invention relates to the improvement of metal bonding strength in polypropylene films through the addition of ethylene in a mini-random ethylene-propylene copolymer in an amount of no more than about 1 weight percent, more preferably no more than about 0.7 weight percent, and most preferably between about 0.3 weight percent and about 0.5 weight percent, or even amounts between about 0.05 weight percent and about 0.2 weight percent. The invention allows the improvement of metal bond strength in metallizable films. The invention encompasses both the resulting films with enhanced metal bond strength and the process for producing such films. In the preferred embodiment, the proposed mini-random copolymer is formed into a film layer used in place of a propylene homopolymer layer, providing improved bonding properties over a simple polypropylene homopolymer, while maintaining at acceptable levels the physical and optical characteristics of a film layer made from a propylene homopolymer, such as stiffness.

15 Claims, 1 Drawing Sheet

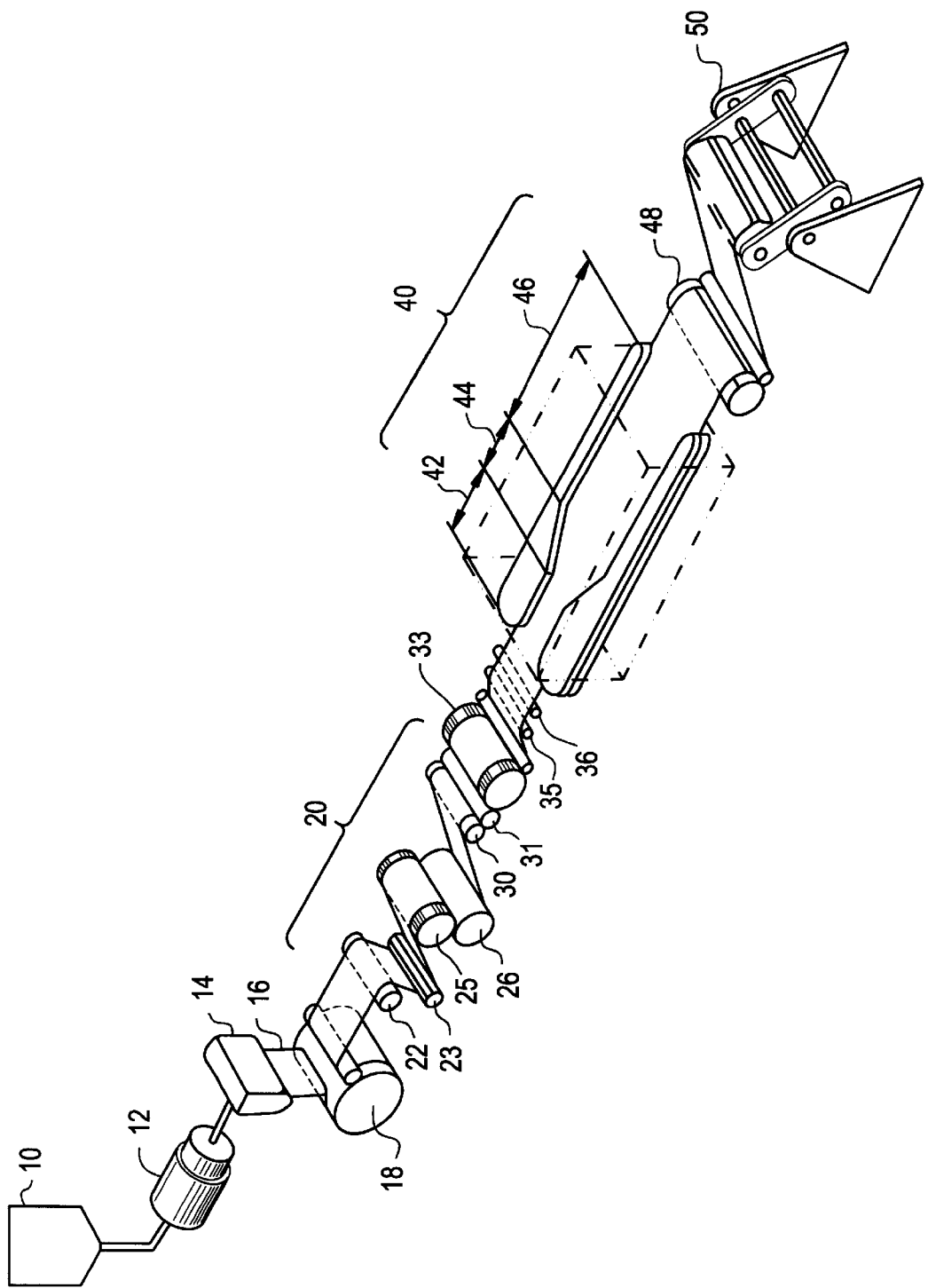

METAL BOND STRENGTH IN POLYOLEFIN FILMS

FIELD OF THE INVENTION

This invention relates to metallizable polyolefin films, and more particularly to the improvement of metal bonding properties of such films.

BACKGROUND OF THE INVENTION

For some packaging films, the barrier properties are improved tremendously by vacuum depositing aluminum onto the surface of biaxially-oriented polypropylene films. Also, for decorating purposes metal deposition may be performed to give the film a reflective coating. Sometimes a lamination or other secondary process is performed which can damage the metal coating. Thus, a strong metal bond between the metal layer and the base or film layer is preferred. This preference extends more generally to other polypropylene films where greater metal bond strength improves the wear-life and quality of a deposited metal layer.

In films where metal coating is put directly onto a homopolymer polypropylene after surface treatment (such as corona treating (also known as corona discharge treating), flame treating, etc.) the metal bond is not noted to be very strong. However, often the physical and optical properties of a homopolymer polypropylene are more desirable to the overall objects of the film, necessitating against the use of a standard ethylene-polypropylene copolymer or ethylene-butene-polypropylene terpolymer, or other multiple polymer system known to have good bonding properties.

The polymers normally employed in the preparation of biaxially-oriented polypropylene films are isotactic polymers such as isotactic polypropylene, although on some occasions the use of syndiotactic polymers has been proposed. Isotactic polypropylene is one of a number of crystalline polymers which can be characterized in terms of the stereoregularity of the polymer chain. Various stereospecific structural relationships denominated primarily in terms of syndiotacticity and isotacticity may be involved in the formation of stereoregular polymers for various monomers.

Isotactic polypropylene is conventionally used in the production of relatively thin films in which the polypropylene is heated and then extruded through dies and subjected to biaxial orientation by stressing the film in both a longitudinal direction (referred to as the machine direction) and in a transverse or lateral direction sometimes referred to as the "tenter" direction. The structure of isotactic polypropylene is characterized in terms of the methyl group attached to the tertiary carbon atoms of the successive propylene monomer units lying on the same side of the main chain of the polymer. That is, the methyl groups are characterized as being all above or below the polymer chain. Isotactic polypropylene can be illustrated by the following chemical formula:

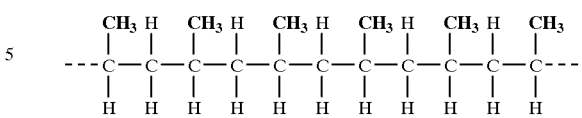

[Bolding for emphasis only]

Another way of describing the structure is through the use of NMR Bovey's NMR nomenclature for an isotactic pentad is . . . mmmm . . . with each "m" representing a "meso" dyad, or successive methyl groups on the same side of the plane of the polymer chain. As is known in the art, any deviation or inversion in the structure of the chain lowers the degree of isotacticity and crystallinity of the polymer.

The isotactic polymers normally employed in the preparation of biaxially-oriented polypropylene films are usually those prepared through the use of conventional Ziegler-Natta catalysts of the type disclosed, for example, in U.S. Pat. Nos. 4,298,718 and 4,544,717, both to Myer et al. Thus, U.S. Pat. No. 5,573,723 to Peiffer et al discloses a process for producing biaxially-oriented polypropylene film based on an isotactic polypropylene homopolymer or propylene-ethylene copolymers. Other copolymers of propylene and alpha-olefins having from 4–8 carbon atoms also may be employed in the Peiffer process.

Catalysts employed in the polymerization of alpha-olefins may be characterized as supported catalysts or unsupported catalysts, sometimes referred to as homogeneous catalysts. Traditional supported catalysts are the so-called "conventional" Ziegler-Natta catalysts, such as titanium tetrachloride supported on an active magnesium dichloride as disclosed, for example, in the aforementioned patents to Myer et al. A supported catalyst component, as disclosed in the Myer '718 patent, includes titanium tetrachloride supported on an "active" anhydrous magnesium dihalide, such as magnesium dichloride or magnesium dibromide. The supported catalyst component in Myer '718 is employed in conjunction with a co-catalyst such as an alkylaluminum compound, for example, triethylaluminum (TEAL). The Myer '717 patent discloses a similar compound which may also incorporate an electron donor compound which may take the form of various amines, phosphenes, esters, aldehydes, and alcohols. Metallocene catalysts are often employed as unsupported or homogeneous catalysts, although, as described below, they also may be employed in supported catalyst components.

Alternative types of catalysts that produce isotactic polyolefins are disclosed in U.S. Pat. Nos. 4,794,096 and 4,975,403. These patents disclose chiral, stereorigid metallocene catalysts that polymerize olefins to form isotactic polymers and are especially useful in the polymerization of highly isotactic polypropylene.

SUMMARY OF THE INVENTION

The present invention relates to metallized polyolefin film. The film includes a film layer formed of an ethylene-propylene copolymer where the ethylene is present in an amount of no more than about 1 weight percent and preferably between about 0.1 weight percent and about 0.7 weight percent. The film layer is surface treated (preferably corona treated) on at least one side (i.e., at least one surface), preferably to a level of at least about 48 dynes/cm as measured contemporaneously with treatment. The film layer is metallized after surface treatment with metal deposited on the treated surface of the film layer. The deposited metal layer has a thickness less than the film layer. The resulting film has a bond strength between the film layer and the metal layer which is at least 30 percent greater than the bond strength between the metal layer material and a correspondingly surface treated film layer formed of polypropylene homopolymer. The present invention further relates to a method for producing such a metallized film.

BRIEF DESCRIPTION OF THE DRAWINGS

FIG. 1 is a diagram of reflecting an exemplary tenterframe process for producing biaxially-oriented polypropylene films.

DETAILED DESCRIPTION OF THE INVENTION

The present invention involves the use of a mini-random ethylene-propylene copolymer in amounts of no more than about 1 percent in combination with propylene in the making of films with enhanced metal bond strengths. While applicable in most propylene films where the basic physical and optical characteristics of a propylene homopolymer layer are needed, but an enhanced bonding strength is desired, the present description focuses on use in biaxially-oriented polypropylene films. Those with skill in the art will recognize the transferability of the same enhanced bonding strength provided by the teachings of the invention regardless of whether a film is oriented in one, two, or no directions.

Biaxially-oriented films are characterized in terms of certain well-defined characteristics relating to their stereoregular structures and physical properties, including melt temperatures and shrinkage characteristics, as well as in relatively low coefficients of friction and relatively high tensile moduli and good barrier properties including relatively low permeation rates to oxygen and water. The biaxially-oriented films of the present invention are formed using a particularly configured polyolefin polymer as described in greater detail below and by using any suitable oriented film production technique, such as the conventionally-used tenter frame process.

The present invention addresses the use of a propylene-ethylene mini-random copolymer with an amount of ethylene no more than about 1 percent. The preferred method involves polymerization of the ethylene and propylene in the presence of an isospecific catalyst as known in the art. The resulting polymer incorporates the ethylene within the isotactic structure and pattern of the propylene. Alternative uses could incorporate the ethylene in an isotactic/syndiotactic polypropylene blend such as that disclosed in U.S. patent application Ser. No. 08/954,324, (entitled Improved Metal Bond Strength in Polypropylene Films, with the same inventive entity as the present application, filed contemporaneously with the present application, the entire disclosure of which is incorporated herein by reference), while maintaining many of the advantages of the proposed invention.

The polymerized mixture will often further include minor amounts (typically less than 1 weight percent, and more typically less than 0.5 weight percent) of additives designed to enhance other physical or optical properties. Such mixtures may have, for example, one or more anti-oxidants present in an amount totaling no more than about 0.25 weight percent (in the tested examples below no more than about 0.15 weight percent) and one or more acid neutralizers present in an amount totaling no more than about 0.25 weight percent (in the tested examples below no more than about 0.05 weight percent). Although not present in the tested examples, additives acting as "anti-block" agents may also be present, again in relatively low percentages such as no more than about 1 weight percent, more preferably no more than about 0.5 weight percent, or alternatively no more than about 0.25 weight percent.

In general, biaxially-oriented film production can be of any suitable technique, such as disclosed in Canadian Patent Application No. 2,178,104 to Peiffer et al. As described in the Peiffer et al application, the entire disclosure of which is incorporated herein by reference, the polymer or polymers used to make the film are melted and then passed through an extruder to a slot die mechanism after which it is passed over a first roller, characterized as a chill roller, which tends to solidify the film. The film is then oriented by stressing it in a longitudinal direction, characterized as the machine direction, and in a transverse direction to arrive at a film which can be characterized in terms of orientation ratios, sometimes also referred to as stretch ratios, in both longitudinal and transverse directions. The machine direction orientation is accomplished through the use of two sequentially disposed rollers, the second or fast roller operating at a speed in relation to the slower roller corresponding to the desired orientation ratio. This may alternatively be accomplished through a series of rollers with increasing speeds, sometime with additional intermediate rollers for temperature control and other functions. After the film has been stressed in the machine direction, it is again cooled and then pre-heated and passed into a lateral stressing section, for example, a tenter frame mechanism, where it is again stressed, this time in the transverse direction. Orientation in the transverse direction is often followed by an annealing section. Subsequently, the film is then cooled and may be subjected to further treatment, such as a surface treatment (for example corona treatment or flame treatment), as described, for example, in the aforementioned Canadian Patent Application 2,178,104 or in U.S. Pat. No. 4,692,380 to Reid, the entire disclosure of which is incorporated here by reference. The film may also be metallized as described in the aforementioned U.S. Pat. No. 4,692,380 to Reid. While corona and flame treatment typically occurs immediately following orientation and prior to the initial roll up, metallizing is typically performed at a separate time and location.

The metal coating (which when applied forms the metal layer) may be applied to one or both surfaces of the film by any known method such as sputtering, vacuum deposition, or electroplating (all of which fall within the definition of "metallizing" the film and involving some act or method of "depositing" a metal onto the surface of the film layer). Vacuum deposition is a preferred method. Preferred values for the average thickness of the metal coating layer are within the range of about 20 to 100 nanometers, with the preferred average thickness for the film to be metallized being within the range of about 0.3 microns to 150 microns. Regardless, the metal layer preferably has a thickness less than the film layer, preferably substantially less than said film layer.

It is preferred to surface treat the surface of the film to be coated (or metallized) through either a corona discharge treatment or a flame treatment in order to improve metal bond strength. In accordance with the present invention, by surface treating (preferably corona treating) the ethylene-propylene copolymer, metal bond strength is further enhanced. Preferably in carrying out the present invention, the ethylene-propylene film layer is surface treated to a level of about 48 dynes/cm or more, providing the most dramatic results as illustrated by the example below.

The most frequently used coating material is aluminum, although other metals such as gold, silver, and copper are also employed on occasion. It is recognized in the art that while the metal coating predominantly consists of the identified metal (such as aluminum) amounts of other additives may be present to improve assorted physical and optical properties of the deposited metal layer. In some occasions, pure aluminum (or the metal of choice) may be used. Other additives may be used in minor amounts such that aluminum (or the metal of choice) is the major component). Preferably aluminum (or the metal of choice) is present in the coating at levels of at least about 90 weight percent, at least about 95 weight percent, and at least about 99 weight percent of the metal coating.

Turning now to FIG. 1, there is shown a schematic illustration of a suitable "Tenter Frame" orientation process which may be employed in producing biaxially-oriented polypropylene film ("BOPP film") in accordance with the present invention. More particularly and with reference to FIG. 1, a source of molten polymer is supplied from a hopper 10 to an extruder 12 and from there to a slot die 14 which produces a flat, relatively thick film 16 at its output. Film 16 is applied over a chill roller 18, and it is cooled to a suitable temperature within the range of about 30–60° C. The film is drawn off the chill roller 18 to a stretching section 20 to which the machine direction orientation occurs by means of idler rollers 22 and 23 which lead to preheat rollers 25 and 26.

As the film is drawn off the chill roller 18 and passed over the idler rollers, it is cooled to a temperature of about 30–60° C. In stretching the film in the machine direction, it is heated by preheat rollers 25 and 26 to an incremental temperature increase of about 60–100° C. and then passed to the slow roller 30 of the longitudinal orienting mechanism. The slow roller may be operated at any suitable speed, usually about 20–40 feet per minute in this type of pilot production line. The fast roller 31 is operated at a suitable speed, typically about 150 feet per minute in a pilot line, to provide a surface speed at the circumference of about 4–7 times that of the slow roller in order to orient the film in the machine direction. In a commercial production line, casting speeds may be much higher such as 20 to 60 meters per minute, with 120 to 360 meters per minute in final speeds.

As the oriented film is withdrawn from the fast roller, it is passed over a roller 33 at room temperature conditions. From here it is passed over tandem idler rollers 35 and 36 to a lateral stretching section 40 where the film is oriented by stretching in the transverse direction. The section 40 includes a preheat section 42 comprising a plurality of tandem heating rollers (not shown) where it is again reheated to a temperature within the range of 130–180° C. From the preheat section 42 of the tenter frame, the film is passed to a stretching or draw section 44 where it is progressively stretched by means of tenter clips (not shown) which grasp the opposed sides of the film and progressively stretch it laterally until it reaches its maximum lateral dimension. Lateral stretching ratios are typically greater than machine direction stretch ratios and often may range anywhere from 5–12 times the original width. Ratios of 8–10 times are usually preferred. The concluding portion of the lateral stretching phase includes an annealing section 46, such as an oven housing, where the film is heated at a temperature within the range of 130–170° C. for a suitable period in time, about 1–10 seconds. The annealing time helps control certain properties, and increased annealing is often specifically used to reduce shrinkage. The biaxially-oriented film is then withdrawn from the tenter frame and passed over a chill roller 48 where it is reduced to a temperature of less than about 50° C. and then applied to take-up spools on a takeup mechanism 50. From the foregoing description, it will be recognized that the initial orientation in the machine direction is carried out at a somewhat lower temperature than the orientation in the lateral dimension. For example, the film exiting the preheat rollers is stretched in the machine direction at a temperature of about 120° C. The film may be cooled to a temperature of about 50° C. and thereafter heated to a temperature of about 160° C. before it is subject to the progressive lateral dimension orientation in the tenter section.

The following examples illustrate the unexpected advantages in metal bond strength at increased levels of surface treatment.

EXAMPLE 1

Resins with and without a mini-random ethylene-propylene copolymer were processed through a biaxially-oriented polypropylene film making process using a tenter frame system and the resulting properties then measured.

The trial was conducted in a sixty inch continuous pilot tenter line. The line was capable of 76.2 meter per minute output and two sided corona discharge treatment. Biaxial orientation of flat films was carried out in two sequential steps. The casted sheet chilled on a rotating cold steel roll was first stretched longitudinally (in the machine direction or "MD") in the tangential gap between sets of rolls rotating at different speeds. Subsequently, the film was stretched transversely (in the transverse direction or "TD") in a tenter frame in which the edges of the film were gripped by a series of clips and diverged in TD. Standard MD draw ratio was 5 in one stage (5x:1x) and that in TD was consistently 9 (1x:9x). The films were surface treated by means of corona discharge treatment (corona treatment) with the level of treatment measured contemporaneously closely following the treatment. Temperature settings are listed in Table 1 below:

TABLE 1

| Temp | Melt | Cast Roll | Chill Roll | MDO Cond | Stretch | Anneal | TDO Cond | Stretch | Anneal |
|---|---|---|---|---|---|---|---|---|---|
| °C. | 221 | 43 | 49 | 116 | 121 | 127 | 166 | 160 | 154 |
| °F. | 430 | 110 | 120 | 240 | 250 | 260 | 330 | 320 | 310 |

This process was used to produce two monolayer BOPP film samples. Sample CS-1 was a controlled sample containing isotactic polypropylene generated using standard Ziegler-Natta catalysis and further including the following additives: Irganox 1010 (an anti-oxidant) in an amount of 0.1 weight percent, Irgafos 168 (an anti-oxidant) in an amount of 0.05 weight percent, and calcium stearate (an acid neutralizer) in an amount of 0.05 weight percent. Sample RE-1 was configured identically with the sole exception that the polypropylene homopolymer was replaced by a propylene-ethylene copolymer containing approximately 0.6 percent by weight ethylene.

The metal bond strength of each of the proceeding sample films was evaluated as follows. The mono-layer films were produced and oriented and then corona-treated at either a "low level" (i.e. 43–47 dynes/cm) or a "high level" (i.e. 52–56 dynes/cm). After production, orientation, and corona treatment, the films were then metallized by vacuum depositing aluminum metal onto one surface of the films. The films were then extrusion laminated with LDPE (low density polyethylene) on the metallized side to another film. The resulting lamination was peeled apart in an Instron. Because of its higher bond strength with polyethylene than with polypropylene, the metal usually adheres to the polyethylene. Thus, the strength required for delamination is the measure of the bond strength of the metal to the polypropylene substrate (the base film). Even if failure were to occur in a different mode, the results would still constitute a minimum boundary for the strength of the polypropylene to metal bond, as that bond would not yet have failed when the alternative failure mode occurred.

The results are summarized in Table 2 below:

TABLE 2

|  | Comparative Example 1 | Example |
|---|---|---|
| Resin Label | CS-1 | RE-1 |
| ethylene, weight percent | 0.0 | 0.6 |
| Lamination Bond Strength | | |
| Maximum, N/m [High Level Corona] | 54 | 87 |
| Averaged, N/m [High Level Corona] | 39 | 66 |
| Maximum, N/m [Low Level Corona] | 90 | 75 |
| Averaged, N/m [Low Level Corona] | 59 | 56 |

These results demonstrate that the use of an ethylene-propylene copolymer including 0.6 percent by weight ethylene in films corona treated at a level between 52–56 dynes/cm provides an improvement in the metal bond strength averaging about 70 percent greater than the metal bond strength of the same metal layer with a correspondingly surface treated (i.e., surface treated using the same method of treatment to about the same level) film formed of non-blended polypropylene homopolymer (i.e., without the addition/presence of ethylene). Further, when the films were corona treated to a level between 52–56 dynes/cm, the maximum bond strength measured for the mini-random ethylene-propylene copolymer was about 60 percent greater than the metal bond strength of the same metal layer with a correspondingly surface treated film formed of non-blended polypropylene homopolymer. Additional improvement of strength would be anticipated with ethylene percentages of up to about 0.8 and even about 1 weight percent, but above about 1 percent it is believed that the deterioration of physical and optical properties of the copolymer will outweigh the potential benefits of continued metal bond strength improvement.

Review of the testing at lower levels of corona treatment (43–47 dynes/cm as measured contemporaneously with treatment) reveal that the advantages gained provide an unexpected trend in metal bonding strength at the increased levels of corona treatment. The control sample of polypropylene homopolymer shows a decrease in bond strength averaging 33 percent and a decrease in the maximum bond strength of 40 percent as its corona treatment is raised from the "low level" to the "high level." In marked contrast, the propylene-ethylene copolymer incorporating small percentages of ethylene shows marked increases in metal bond strength. These results demonstrate that, contrary to the normal trend, where greater metal bond strength is desired at increasing levels of surface treatment (preferably corona treatment) above 43–47 dynes/cm such as at least about 48 dynes/cm, between about 48–56 dynes/cm or more preferably between about 52–56 dynes/cm (all as measured contemporaneously with treatment), the addition of small percentages of ethylene is particularly advantageous.

Additionally, related information disclosed in U.S. patent application Ser. No. 08/953,523, (entitled Improved Heat Seal Strength in Polyolefin Films, with the same inventive entity as the present application, filed contemporaneously with the present application, the entire disclosure of which is incorporated herein by reference), suggests that increased bonding benefits without significant changes in physical or optical properties from those observed for propylene homopolymer may be obtained using surprisingly low levels of ethylene such as between about 0.1–0.2 weight percent, or even as low as about 0.05 weight percent. Thus the use of no more than about 1.0 weight percent, preferably between about 0.05–0.8 weight percent, more preferably between about 0.1–0.7 weight percent, and most preferably between about 0.3–0.5 weight percent, is believed to provide enhancement of metal bond strength of at least about 40 percent over the strength of the bond between the metal material and a correspondingly surface treated film formed of polypropylene homopolymer. For ethylene content between about 0.5–0.7 weight percent, and specifically about 0.6 weight percent these advantages are anticipated to be at least about 50 percent, and potentially to average at least about 60 percent. Particularly at the lower levels of ethylene content, specifically between about 0.05–0.4 weight percent, more specifically between about 0.1–0.2 weight percent, it is believed that the advantages in metal bond strength may extend to even lower levels of corona treatment than that shown in the test results above. Enhancements may only be in the range of about 15 percent to about 30 percent over the bond strength using a film formed of polypropylene homopolymer, or they may even extend to at least about 40 percent or even at least about 50 percent improvements nearing those seen at the 0.6 weight percent ethylene of the example.

Having described specific embodiments of the present invention, it will be understood that modifications thereof may be suggested to those skilled in the art, and it is intended to cover all such modifications as fall within the scope of the appended claims.

What is claimed:

1. In a polyolefin film, the combination comprising:
   a. a film layer formed of ethylene-propylene copolymer having an isotactic structure characterized by successive meso dyads of successive methyl groups on the same side of the plane of the polymer chain and which is surface treated on at least one surface;
   b. a metal layer deposited onto said treated surface of said film layer, said metal layer being contiguous to said film layer and having a thickness less than said film layer; and
   c. said ethylene being present in said film layer in an amount within the range of 0.05–0.8 weight percent which is effective to provide a bond strength with said metal layer which is at least about 30 percent greater than the bond strength between said metal layer material and a correspondingly surface treated film layer formed of polypropylene homopolymer.

2. The combination of claim 1, wherein said metal layer has a thickness within the range of about 20 nanometers to 100 nanometers and said film layer has a thickness within the range of about 0.3 microns to 150 microns, said metal layer having a thickness less than said film layer.

3. The combination of claim 1, wherein said bond strength between said metal layer and said film layer is at least 50 percent greater than the bond strength between said metal layer material and a correspondingly surface treated film layer formed of polypropylene homopolymer.

4. The combination of claim 3, wherein said film layer is surface treated on said at least one surface to a level of at least about 48 dynes/cm as measured contemporaneously with the treatment.

5. The combination of claim 3, wherein said film layer is surface treated on said at least one surface to a level between about 48 dynes/cm and about 56 dynes/cm as measured contemporaneously with the treatment.

6. The combination of claim 1, wherein said film layer formed of ethylene-propylene copolymer contains ethylene in an amount between about 0. 1 weight percent and about 0.7 weight percent.

7. The combination of claim 4, wherein said film layer formed of ethylene-propylene copolymer contains ethylene in an amount between about 0.5 weight percent and about 0.7 weight percent.

8. The combination of claim 1, wherein said film layer formed of ethylene-propylene copolymer contains ethylene in an amount between about 0.3 weight percent and about 0.5 weight percent.

9. The combination of claim 1, wherein said metal layer contains aluminum.

10. The combination of claim 1, wherein said metal layer contains aluminum in an amount of at least about ninety weight percent.

11. The combination of claim 1, wherein said metal layer contains aluminum in an amount of at least about ninety-five weight percent.

12. The combination of claim 1, wherein said metal layer contains aluminum in an amount of at least about ninety-nine weight percent.

13. The combination of claim 1, wherein said polyolefin film is oriented in at least one direction prior to the deposition of said metal layer.

14. The combination of claim 1, wherein said polyolefin film is biaxially oriented prior to the deposition of said metal layer.

15. The combination of claim 1, wherein said ethylene-propylene copolymer further comprises at least one anti-oxidant in an amount of no more than about 0.25 weight percent and at least one acid neutralizer in an amount of no more than about 0.25 weight percent.

* * * * *